(12) United States Patent
Goebl

(10) Patent No.: US 6,870,738 B2
(45) Date of Patent: Mar. 22, 2005

(54) POWER SEMICONDUCTOR MODULE

(75) Inventor: Christian Goebl, Nuremberg (DE)

(73) Assignee: Semikron Elektronik GmbH, Numberg (DE)

( * ) Notice: Subject to any disclaimer, the term of this patent is extended or adjusted under 35 U.S.C. 154(b) by 0 days.

(21) Appl. No.: 10/401,387

(22) Filed: Mar. 27, 2003

(65) Prior Publication Data

US 2003/0235038 A1 Dec. 25, 2003

(30) Foreign Application Priority Data

Mar. 27, 2002 (DE) .......................................... 102 13 648

(51) Int. Cl.[7] .............................................. H05K 7/20
(52) U.S. Cl. ...................... 361/719; 361/715; 361/707
(58) Field of Search ................................. 361/688–690, 361/707, 709, 711–722; 165/80.3, 185; 174/16.3

(56) References Cited

U.S. PATENT DOCUMENTS

| | | | | |
|---|---|---|---|---|
| 4,707,726 A | * | 11/1987 | Tinder | 174/252 |
| 5,065,279 A | * | 11/1991 | Lazenby et al. | 361/720 |
| 5,184,211 A | * | 2/1993 | Fox | 257/706 |
| 5,276,584 A | * | 1/1994 | Collins et al. | 361/718 |
| 5,307,236 A | * | 4/1994 | Rio et al. | 361/720 |
| 5,402,313 A | * | 3/1995 | Casperson et al. | 361/710 |
| 5,623,394 A | * | 4/1997 | Sherif et al. | 361/705 |
| 5,710,459 A | * | 1/1998 | Teng et al. | 257/717 |
| 5,905,636 A | * | 5/1999 | Baska et al. | 361/705 |
| 6,043,981 A | * | 3/2000 | Markow et al. | 361/704 |
| 6,091,603 A | * | 7/2000 | Daves et al. | 361/704 |
| 6,147,866 A | * | 11/2000 | Saito et al. | 361/704 |
| 6,249,434 B1 | * | 6/2001 | Scafidi | 361/704 |
| 6,519,156 B2 | * | 2/2003 | Scafidi | 361/704 |

FOREIGN PATENT DOCUMENTS

| | | |
|---|---|---|
| DE | 9648562 C2 | 11/1996 |
| DE | 9903876 A1 | 2/1999 |
| JP | 11026914 A * 1/1999 | ............ H05K/3/22 |

* cited by examiner

Primary Examiner—Anatoly Vortman
(74) Attorney, Agent, or Firm—Andrew F. Young, P.C.

(57) ABSTRACT

The invention provides a power semiconductor module including a power converter module with an improved configuration technology that minimizes or eliminates the need for a positive bonding (soldering/adhesive) connection between a power semiconductor element and a contact surface of a substrate. The present invention includes a housed or encapsulated power semiconductor element with a pre-secured connecting element that reduces manufacturing time and costs, while improving performance capability in a decreased size.

12 Claims, 3 Drawing Sheets

POWER SEMICONDUCTOR MODULE

This application claims the priority benefit of DE 102 13 648.3, filed Mar. 27, 2003, the contents of which are incorporated herein by reference.

BACKGROUND OF THE INVENTION

1. Field of the Invention

The present invention relates to an improved power semiconductor module having active and passive components including a power converter module. More specifically, the present invention relates to a power semiconductor module that includes a housed (encapsulated) power semiconductor element having contact elements and offers substantial manufacturing advantages.

2. Description of the Related Art

Several power semiconductor modules with active and passive components (including power converter modules) have been described in the literature. Unfortunately, efforts to improve performance capacity, reliability, and life expectancy, while simultaneously decreasing manufacturing costs have been unsuccessful Modern power semiconductor modules, are modules without base plates, as can be seen in, for example DE 199 03 875 A1. This type of modern power semiconductor module includes:

(1) an outer housing, (2) a ceramic substrate supporting circuit-capable metallic laminations arranged, for example, by the DCB (direct copper bonding) process, (3) electronic components such as diodes, transistors, resistors or sensors applied with positive connections to the substrate by means of a soldering technique, (4) bondings that join the structured side of an unhoused (unencapsulated) chip-shaped power semiconductor components with other components and/or the substrate and/or the connecting elements leading outside, and (5) a rubber-bonding (preferably silicone based) compound surrounds each of the electronic components and electrically insulates the individual components.

One disadvantage of the conventional design is that, particularly for large-surface solder joints on heat sinks, it is difficult to predictably control the quality of the solder joint. Low-quality solder joints and lack of process predictability reduce the reliability and the life expectancy of the resultant power semiconductor modules. Consequently, it has been found advantageous for power semiconductor modules to use a configuration that provides a pressure contact solely between the module and the heat and eliminates the need to solder the module directly to the heat sink.

Unfortunately, pressure buildup in pressure-contacted power semiconductor modules is conventionally accomplished by means of a mechanically stable pressure plate. Depending on the type of conventional embodiment, the produced pressure is transmitted directly to the substrate by specifically designed pressure pieces of the pressure plate, (as shown in DE 196 48 562 C1), or by an elastic pressure accumulator (as shown in DE 199 03 875 A1).

Unfortunately, the power semiconductor modules shown in DE 196 48 562 C1 and DE 199 03 875 A1, as is customary in modern modules, have the disadvantage of requiring a large and complex array of power semiconductor elements. Each of these power semiconductor elements must be reliably, cheaply, and quickly contacted either with each other, or with a substrate. Technically, these connections (alternatively known hereinafter as bondings or solderings) are accomplished by a large number of individual wire bondings (wire solderings), often positioned in awkward and tight configurations. These bondings extend from the middle/top portion of a power semiconductor element to an outer contact surface. Consequently, it is quite common to use up to ten (10) bondings per component to ensure reliability in a range of difficult environments. Since each of the bondings is necessarily made in a serial-production manner (one wire bonding at a time), their manufacture takes considerable time and thus represents a substantial portion of the manufacturing cost of each power semiconductor module. Efforts to speed up this serial manufacturing process, by employing quicker machine actuation, has reached a plateau in recent years. Additionally, since each bonding requires space in the module, the large number of bondings prevents simple module minimization.

Referring now to FIG. 1, a power semiconductor module on a heat sink 10 in a housing 60 includes, a substrate 20 with a first metallic lamination 210 contacting heat sink 10, and a second metallic lamination 220 (also known hereinafter as a contact element 220) opposite heat sink 10. Second metallic laminations 220 (contact elements 220) are formed in a conventional circuit-friendly structure (as required by the circuit design) and operate as electro-conductive contact surfaces.

Multiple unhoused (unencapsulated) chip-shaped power semiconductor elements 30 are arrayed on, and electrically connect with, second metallic laminations 220, as shown. Conventionally, bonding techniques used to join second metallic laminations 220 with power semiconductor elements 30 include forming a soldered joint or an adhesive bonded joint. This type of adhesive bonded joint is established with electrically conductive adhesives.

Additional electrical bondings, formed as wire bondings 310, are soldered to and extend from a top surface of power semiconductor elements 30 (opposite substrate 20) and contact and are soldered to second metallic laminations 220 (contact elements 220). Main connections 70 and auxiliary connections 80 are secured to substrate 20 to enable later electrical connection between the power semiconductor module and external components. Alternative components may include a sensor 50 and are secured to substrate 20 as desired by a manufacturer. Finally, after conventional assembly, the individual electrical components are electrically insulated by and covered with a sealing compound 90.

Unfortunately, the necessary use of sealing compound 90 with the conventional design eliminates non-destructive testing of components, easy replacement of components, and easy repair of the entire power semiconductor module.

OBJECTS AND SUMMARY OF THE INVENTION

An object of the present invention is to provide a power semiconductor module that enables the easy replacement of at least one unhoused (unencapsulated) chip-shaped power semiconductor element with a housed (encapsulated) power semiconductor element.

It is another object of the present invention is to provide a power semiconductor module that eliminates several of the required bondings (solderings) for electrical connection between a power semiconductor element and a contact surface through the implementation of a housed power semiconductor having contact elements directly contacting contact surfaces.

It is another object of the present invention to provide a power semiconductor module that enables secure electroconnective and secure thermoconnective connections between a housed (encapsulated) power semiconductor element and a contact surface.

It is another object of the present invention is to provide a power semiconductor module system that improves performance capacity, reliability, life expectancy while reducing manufacturing costs.

It is another object of the present invention to clearly answer the now-apparent absolute requirement of changing the configuration technology for the individual components in order to reach the goals of decreasing manufacturing costs, while improving capacity, reliability, and unit life expectancy over conventional serial assembly methods.

It is the object of the present invention to present a power semiconductor module in which at least some of the bondings to electrically connect the power semiconductor element with the contact surfaces of the substrate can be eliminated.

The present invention relates to a power semiconductor module including a power converter module with an improved configuration technology that minimizes or eliminates the need for a positive bonding (soldering/adhesive) connection between a power semiconductor element and a contact surface of a substrate. The present invention includes a housed (or encapsulated) power semiconductor element with a pre-secured connecting element that reduces manufacturing time and costs, while improving performance capability in a decreased size.

According to one embodiment of the present invention, there is provided a power semiconductor module, comprising: a substrate mountable on an external heat sink, a plurality of electroconductive contact surfaces on at least a first side of the substrate opposite the external heat sink, at least one housed element on at least one of the plurality of contact surfaces, the at least one housed element having at least one contact element extending from the housed element prior to an assembly of the power semiconductor module, the at least one housed element being a power semiconductor element, a first part of the at least one contact element in an electroconductive connection with at least one of the contact surfaces, and a housing bounding the power semiconductor module, whereby the at least one housed element having the at least one contact element minimizes a number of electrical bondings during the assembly.

According to another embodiment of the present invention, there is provided a power semiconductor module, further comprising: a cover member in the housing, at least one pressing member extending away from the cover member toward the substrate, the at least one pressing member in a pressing contact with at least one of the housed element and the contact element after the assembly, and the at least one pressing member enabling at least one of a secure thermoconductive and a secure electroconductive connection between the at least one of the housed element and the contact element, and respective the contact surface, thereby minimizing a need for a positive bonding during the assembly.

According to another embodiment of the present invention, there is provided a power semiconductor module, wherein: at least one of pressing members is in the pressing contact with the substrate after the assembly.

According to another embodiment of the present invention, there is provided a power semiconductor module, further comprising: a cushion element on a top surface of one of the housed elements opposite the substrate, a broad foot portion on an end of at least one of the pressing members opposite the cover member, and the broad foot portion in the pressing contact with the cushion element, whereby the cushion element distributes the pressing contact over the top surface of the housed element during the assembly.

According to another embodiment of the present invention, there is provided a power semiconductor module, wherein: the first part of the at least one contact element extending between the at least one housed element and the contact surface and separating the housed element from the contact surface, and the first part of the at least one contact element enabling at least one of the electroconductive and a thermoconductive connection between the at least one housed element and the contact surface, whereby the power semiconductor module is reduced in size while maintaining heat dissipation effectiveness.

According to another embodiment of the present invention, there is provided a power semiconductor module, further comprising: a cover member in the housing, at least one pressing member extending away from the cover member toward the substrate, the at least one pressing member in a pressing contact with the housed element after the assembly, and the at least one pressing member enabling the at least one of the thermoconductive and the electroconductive connection between the housed element, the contact element, and the contact surface, thereby minimizing a need for a positive-bond soldering during the assembly.

According to another embodiment of the present invention, there is provided a power semiconductor module, further comprising: a cushion element on a top surface of one of the housed elements opposite the substrate, a broad foot portion on an end of at least one of the pressing members opposite the cover member, and the broad foot portion in the pressing contact with the cushion element, whereby the cushion element distributes the pressing contact over the top surface of the housed element during the assembly.

According to another embodiment of the present invention, there is provided a power semiconductor module, further comprising: means for pressing at least one of the housed element and the first part of the contact element into a secure pressing contact with the contact surface, at least a one pressing member in the means for pressing, and the pressing member urging the at least one of the housed element and the first part into at least one of a secure thermoconductive and a secure electroconductive connection with the contact surface, thereby minimizing a need for a positive binding during the assembly.

According to another embodiment of the present invention, there is provided a power semiconductor module, further comprising: a cover member in the housing, at least one pressing member in the means for pressing, the pressing member extending away from the cover member toward the substrate, and the at least one pressing member in a pressing contact with at least one of the housed element and the contact element after the assembly.

According to another embodiment of the present invention, there is provided a power semiconductor module, further comprising: means for cushioning a top surface of one of the housed elements opposite the substrate, the means for cushioning including a cushion element, a broad foot portion on an end of at least one of the pressing members opposite the cover member, and the broad foot portion in the pressing contact with the cushion element, whereby the cushion element distributes the pressing contact over the top surface of the housed element during the assembly.

According to another embodiment of the present invention, there is provided a method for assembling a power semiconductor module, comprising the steps of: securing at least a substrate on an external heat sink, providing at least a plurality of electroconductive contact surfaces on at least a first side of the substrate opposite the external heat sink, positioning at least one housed element on at least one of the plurality of contact surfaces, the at least one housed element including at least one contact element extending from the housed element prior to the step of positioning, the at least one housed element being a power semiconductor element, connecting a first part of the at least one contact element in an electroconductive connection with at least one of respective the contact surfaces, and attaching a housing bounding the power semiconductor module to the external heat sink, whereby the at least one housed element having the at least one contact element minimizes a number of electrical bondings in the power semiconductor module.

According to another embodiment of the present invention, there is provided a method for assembling a power semiconductor module, wherein the step of attaching the housing further comprises the steps of: providing a cover member on the housing, at least one pressing member extending away from the cover member toward the substrate, affixing the cover member to the housing, the at least one pressing member in a pressing contact with at least one of the housed element and the contact element, and the at least one pressing member enabling at least one of a secure thermoconductive and a secure electroconductive connection between the at least one of the housed element and the contact element, and the contact surface, thereby minimizing a need for a positive bonding during the step of connecting.

The above, and other objects, features and advantages of the present invention will become apparent from the following description read in conduction with the accompanying drawings, in which like reference numerals designate the same elements.

DETAILED DESCRIPTION OF THE PREFERRED EMBODIMENTS

The present invention enables replacement of at least one unhoused (unencapsulated) chip-shaped power semiconductor element with a housed (encapsulated) power semiconductor for improved manufacturing. Further, the housed semiconductor elements have the advantage that they include connecting elements extending from the housing, with which the same electrical contacts can be established as those established in conventional designs by means of wire bondings. Consequently, the present invention may be immediately placed into service with conventional manufacturing practices for substantial benefit. Both, the housed and unhoused power semiconductor elements may be connected with the substrate using conventional soldering or adhesive, but only the present invention provides for assured contact without these traditional bonding techniques.

Figure 1:
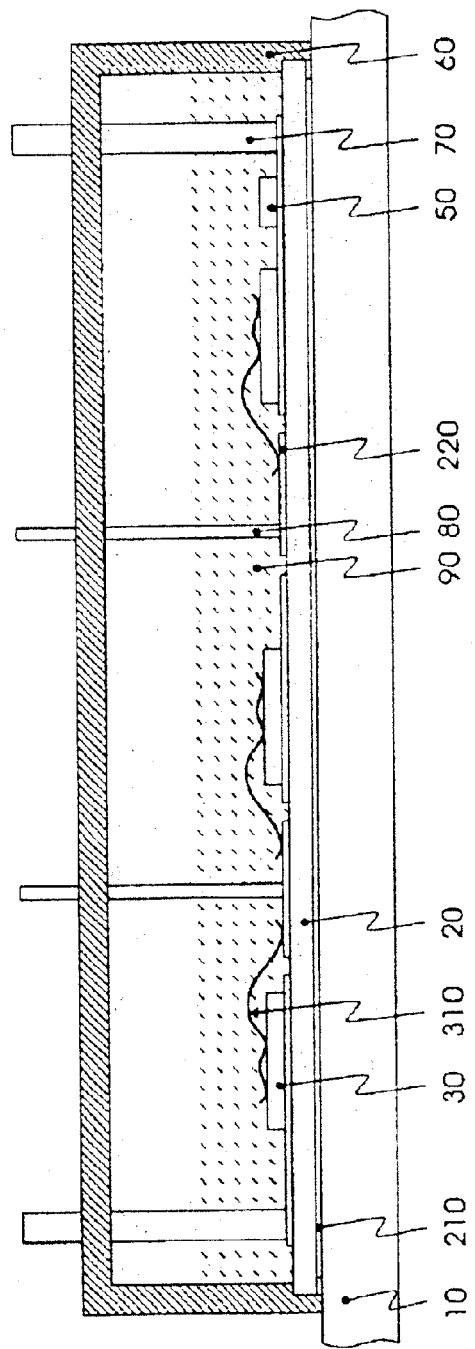
FIG. 1 is a side view of a conventional power semiconductor module.
Figure 2:
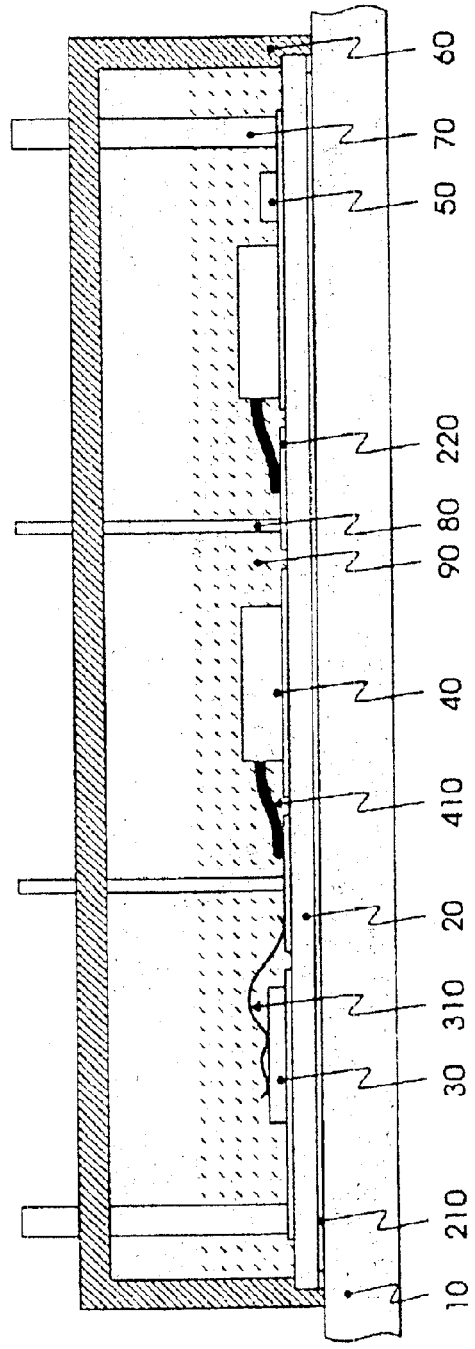
FIG. 2. is a side view of a power semiconductor module according to one embodiment of the present invention.

Referring now to FIG. 2, a power semiconductor module includes a set of housed power semiconductor elements 40 in place of conventional individual chip-shaped unhoused power semiconductor elements 30, as noted above. In the present embodiment, housed power semiconductor elements 40 are electrically bonded (by a soldering or an adhesive technique) with second metallic laminations 220 (contact surface 220) often with a thermo-conductive adhesive. In this manner, housed power semiconductor elements 40 are electroconductively and thermoconductively joined with substrate 20.

Connective elements 410, electrically connect housed power semiconductor elements 40 with second metallic laminations 220 (contact surfaces) by bonding (soldering or adhesive). The other components are assembled as in a conventional power semiconductor module.

It is important that the heat transfer from power semiconductor elements 40 to heat sink 10 be designed within dimensions compatible with those of the respective conventional arts. This is guaranteed, for example, by using conventionally dimensioned, housed semiconductor elements 40, in a "TO-" housing with an integrated heat range.

Figure 3:
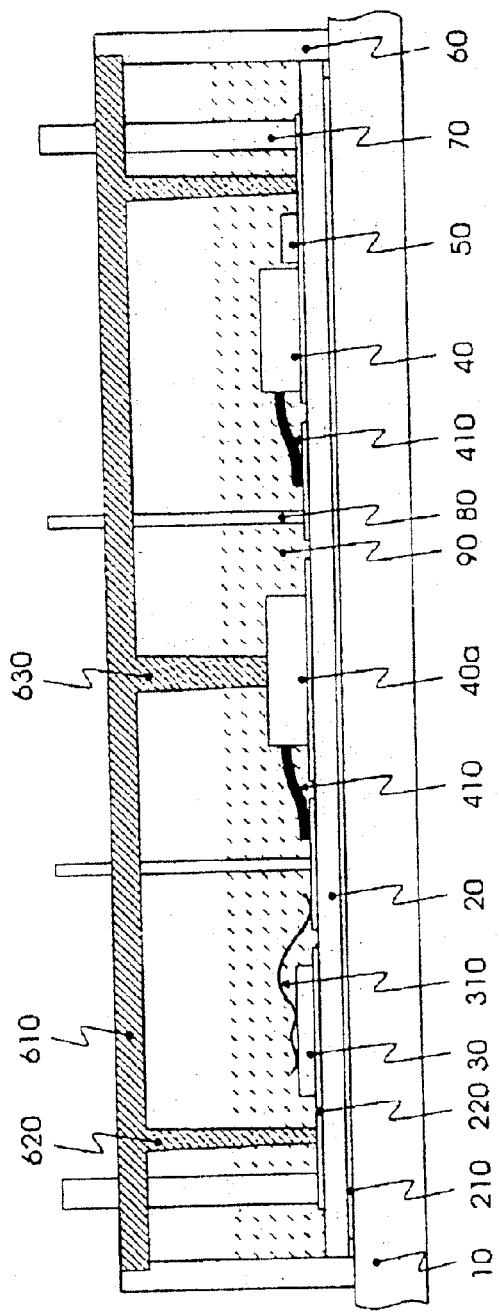
FIG. 3 is a side view of a power semiconductor module according to another embodiment of the present invention.

Referring now to FIG. 3, an embodiment of a power semiconductor module replaces a portion of housing 60 with a pressure-contact design having individual pressure pieces 620 extending from a separate cover 610. During an assembly, cover 610 is secured to bounding housing 60, as shown. In this manner, individual pressure pieces 620 promote heat transfer between the components of the power semiconductor element by pressing substrate 20 against heat sink 10.

In the present embodiment, the heat transfer provided by pressure pieces 620 is effective solely to secure substrate 20 on heat sink 10. At least one expanded pressure piece 630 substantially augments thermal transfer from housed power semiconductor element 40a to substrate 20 and separate cover 610. Pressure piece 630 presses against a top of housed power semiconductor element 40a after installation, and maintains power semiconductor element 40a in a secure thermo and electroconductive manner against contact portions 220, allowing dissipations of heat and any inappropriate charge.

Together, separate cover 610 and pressure pieces 620, 630 form a thermal bond between respective heat sink 10 and housed power semiconductor element 40a of such efficiency that a positive-bond such as soldering or adhesive is no longer necessary to facilitate an effective thermo-conductive contact. In an alternative embodiment, an additional thermo-conductive medium (not shown) may be positioned between power semiconductor element 40 and substrate 20 or metallic lamination contact surface 220.

Figure 4:
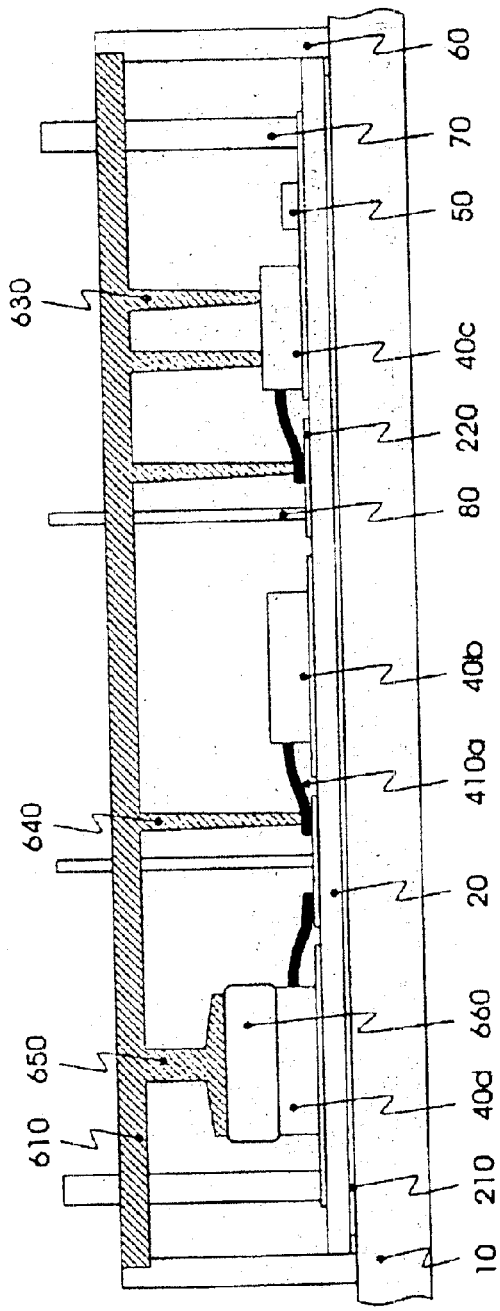
FIG. 4 is a side view of a power semiconductor module according to another embodiment of the present invention.

Referring now to FIG. 4, an alternative embodiment of the present invention shows a power semiconductor module with pressure contacts and no sealing compound. In this embodiment, the innovative pressure contacts noted above are reformed into alternative pressure contacts 630, 640, and 650, as will be explained.

Pressure contact 640 extends from cover 610 and applies pressure to a contacting element 410a of a power semiconductor element 40b. Since pressure contact 640 ensures an enabling electroconductive contact between contacting element 410a and respective metallic laminations 220 (contact surfaces 220), this embodiment eliminates the need for expensive and time consuming soldering or adhesive bonding steps.

Pressure contacts 630 similarly extend from cover 610 and press a power semiconductor element 40c against corresponding portions of metallic lamination contact surface 220 (contact surfaces 220). Here, the two prongs of pressure contacts 630 provide multiple benefits, (1) a balanced pressure along a top of power semiconductor element 40c that enables both uniform pressure with contact surfaces 220 and more effective heat dissipation, and (2) a secure electroconductive transition to contact surfaces 220 without soldering or adhesive joints.

Pressure contact 650 is formed with a broad foot portion that contacts a portion of an elastic cushion element 660 on a top of a power semiconductor element 40d. Here, contact pressure is not applied directly to power semiconductor element 40d but to elastic interface (elastic cushion element 660). In combination, the broad foot portion of pressure contact 650 and elastic cushion element 660 enable rapid uniform pressure and a secure electroconductive and thermoconductive bonding contact surface 220 without a requirement for soldering or adhesive bonding. Additionally, since elastic cushion element 660 can absorb minor production defects in a length of pressure contact 650 or power semiconductor element 40d, the present embodiment allows for use of lower cost components in the module and faster assembly rates.

In alternative embodiments, pressure contact 650 and its broad foot portion may be designed to overlap one or more power semiconductor elements 40d. Elastic cushion element 660 may also be designed to overlap one or more power semiconductor elements 40d for a similar purpose.

In the present embodiment, since pressure contacts 630, 640, and 650 provide all the necessary securing measures there is no requirement for sealing compound 90, which allows multiple benefits, including simple and non-destructive component testing and replacement, cheaper and quicker assembly, and safer assembly without the presence of potentially harmful adhesive compounds.

Figure 5:
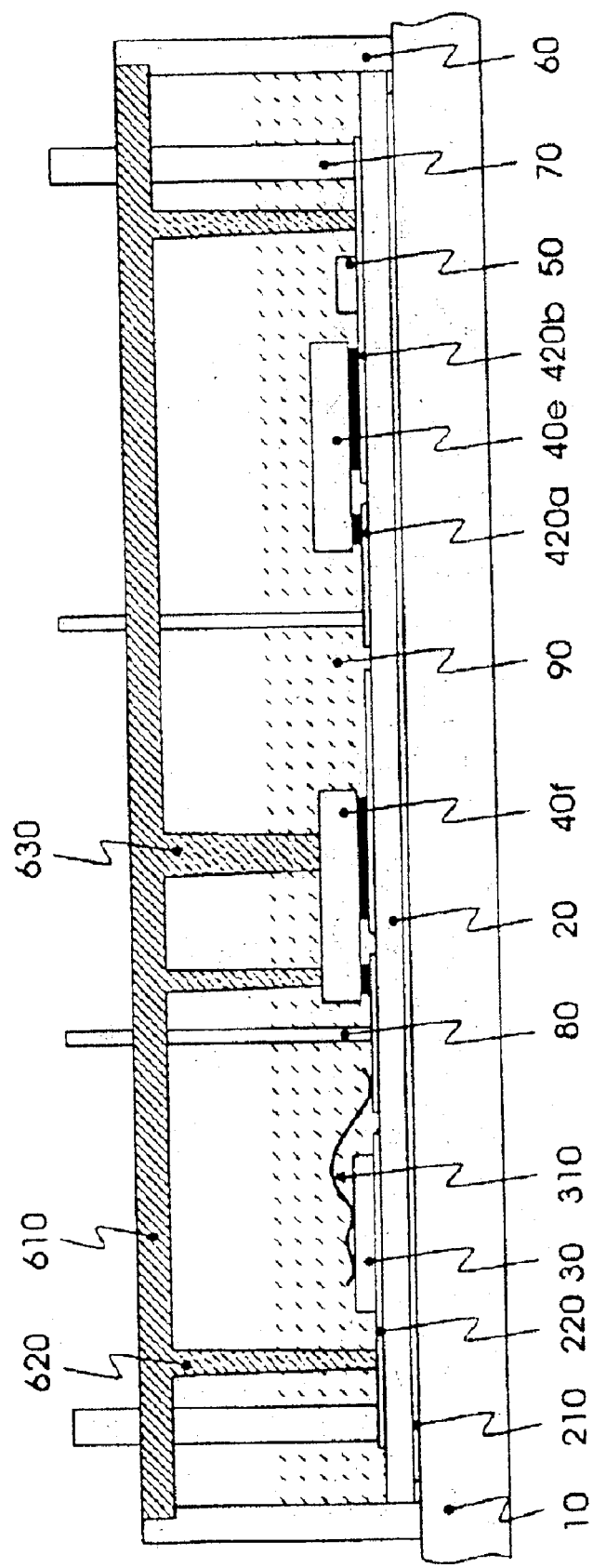
FIG. 5 is a side view of an alternative embodiment of the power semiconductor module as shown in FIG. 3.

Referring now to FIG. 5, an alternative embodiment includes a connecting element 420a and a connecting element 420b, positioned between a power semiconductor element 40e and corresponding portions of circuit-friendly contact surfaces 220 (metallic lamination 220). Connecting elements 420a, 420b electroconductively and thermoconductively connect with corresponding portions of circuit-friendly contact surfaces 220 (metallic lamination 220). In this manner, power semiconductor element 40e connects with metallic lamination contact surface 220 with a positive bond, for example, soldering or adhesive since no downward pressure is applied on power semiconductor element 40e.

As with power semiconductor element 40e, power semiconductor element 40f is thermally and electrically connected with metallic lamination contact surface 220 (contact surface 220) by a pressure contact by pressure contacts 630. It should be understood, that the size and shape of pressure contacts 630 is adaptable depending upon the degree of thermal or electrical contact required with connecting elements 420a, 420b and metallic lamination contact surface 220. As can be seen, the individual pressure contact 630 positioned over larger sized connecting element 420b, is larger to correspond to the larger quantity of pressure and stability required to provide a secure electrical and thermal bond through connecting element 420b. In contrast, the individual pressure contact 630 positioned over smaller sized connecting element 420a, is smaller to correspond to the smaller quantity of pressure required to provide a secure electrical and thermal bond through connecting element 420a.

It should be understood, that the present embodiment provides the particular benefit of reduced space, since connecting elements 420a, 420b are positioned between power semiconductor elements 40e and 40f. Consequently, electrical elements in the power semiconductor module may be positioned closely together in a rapid manner during manufacture. Where pressure contacts 630, or other pressure contacts (previously described) are involved, no additional welding, adhesive, or sealing compound is needed to secure respective power semiconductor elements.

The multiple embodiments of present invention enable the use of housed power semiconductor modules and provide many benefits. These benefits include at least the following items. First, a greatly simplified manufacturing process, as no mechanically sensitive or fragile unhoused (unencapsulated) power semiconductor elements are used they may be packed tightly and moved rapidly without risk. Second, an inexpensive manufacturing process as the invention allows the more efficient use of the customary conventional assembly tools that are already understood and available in the industry. Third, a faster and cheaper manufacturing process for power semiconductor modules, as the complex wiring bondings normally required are at least partially eliminated. Fourth, a faster manufacturing process since the use of housed power semiconductor modules allows testing at an earlier production stage since component installation is secured by the housing itself, not only after the introduction of a sealing compound. Fifth, since pressure can be applied to the housings themselves without damage, the housed power semiconductor elements are accessible for speedy pressure contact during assembly. Sixth, a reduction in cost through the elimination or reduction of the now-unnecessary sealing compounds. Seventh, since the modules are accessible for rapid repair, defective individual power semiconductor elements are not soldered to the substrate (eliminating substrate damage), and can be replaced without destructive repair.

Although only a single or few exemplary embodiments of this invention have been described in detail above, those skilled in the art will readily appreciate that many modifications are possible in the exemplary embodiment(s) without materially departing from the novel teachings and advantages of this invention. Accordingly, all such modifications are intended to be included within the spirit and scope of this invention as defined in the following claims.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies entirely on friction between a wooden part and a cylindrical surface, a screw's helical surface positively engages the wooden part, and a bolt's head and nut compress opposite sides of at least one wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A power semiconductor module, comprising:

a substrate mountable on an external heat sink;

a plurality of electroconductive contact surfaces on at least a first side of said substrate opposite said external heat sink;

at least one housed element on at least one of said plurality of contact surfaces;

said at least one housed element having at least one contact element extending from said housed element prior to an assembly of said power semiconductor module;

said at least one housed element being a power semiconductor element;

a first part of said at least one contact element in an electroconductive connection with at least one of said contact surfaces; and a housing bounding said power semiconductor module, whereby said at least one housed element having said at least one contact element minimizes a number of electrical bondings during said assembly.

2. A power semiconductor module, according to claim 1, further comprising:
- a cover member in said housing;
- at least one pressing member extending away from said cover member toward said substrate;
- said at least one pressing member in a pressing contact with at least one of said housed element and said contact element after said assembly; and
- said at least one pressing member enabling at least one of a secure thermoconductive and a secure electroconductive connection between said at least one of said housed element and said contact element, and respective said contact surface, thereby minimizing a need for a positive bonding during said assembly.

3. A power semiconductor module, according to claim 2, wherein: at least one of pressing members is in said pressing contact with said substrate after said assembly.

4. A power semiconductor module, according to claim 2, further comprising:
- a cushion element on a top surface of one of said housed elements opposite said substrate;
- a broad foot portion on an end of at least one of said pressing members opposite said cover member; and
- said broad foot portion in said pressing contact with said cushion element, whereby said cushion element distributes said pressing contact over said top surface of said housed element during said assembly.

5. A power semiconductor module, according to claim 1, wherein:
- said first part of said at least one contact element extending between said at least one housed element and said contact surface and separating said housed element from said contact surface; and
- said first part of said at least one contact element enabling at least one of said electroconductive and a thermoconductive connection between said at least one housed element and said contact surface, whereby said power semiconductor module is reduced in size while maintaining heat dissipation effectiveness.

6. A power semiconductor module, according to claim 5, further comprising:
- a cover member in said housing;
- at least one pressing member extending away from said cover member toward said substrate;
- said at least one pressing member in a pressing contact with said housed element after said assembly; and
- said at least one pressing member enabling said at least one of said thermoconductive and said electroconductive connection between said housed element, said contact element, and said contact surface, thereby minimizing a need for a positive-bond soldering during said assembly.

7. A power semiconductor module, according to claim 6, further comprising:
- a cushion element on a top surface of one of said housed elements opposite said substrate;
- a broad foot portion on an end of at least one of said pressing members opposite said cover member; and
- said broad foot portion in said pressing contact with said cushion element, whereby said cushion element distributes said pressing contact over said top surface of said housed element during said assembly.

8. A power semiconductor module, according to claim 1, further comprising:
- means for pressing at least one of said housed element and said first part of said contact element into a secure pressing contact with said contact surface; and
- said means for pressing urging said at least one of said housed element and said first part into at least one of a secure thermoconductive and a secure electroconductive connection with said contact surface, thereby minimizing a need for a positive binding during said assembly.

9. A power semiconductor module, according to claim 8, further comprising:
- a cover member in said housing;
- at least one pressing member in said means for pressing; said pressing member extending away from said cover member toward said substrate; and
- said at least one pressing member in a pressing contact with at least one of said housed element and said contact element after said assembly.

10. A power semiconductor module, according to claim 9, further comprising:
- means for cushioning a top surface of one of said housed elements opposite said substrate;
- said means for cushioning including a cushion element;
- a broad foot portion on an end of at least one of said pressing members opposite said cover member; and
- said broad foot portion in said pressing contact with said cushion element, whereby said cushion element distributes said pressing contact over said top surface of said housed element during said assembly.

11. A method for assembling a power semiconductor module, comprising the steps of:
- securing at least a substrate on an external heat sink;
- providing at least a plurality of electroconductive contact surfaces on at least a first side of said substrate opposite said external heat sink;
- positioning at least one housed element on at least one of said plurality of contact surfaces;
- said at least one housed element including at least one contact element extending from said housed element prior to said step of positioning;
- said at least one housed element being a power semiconductor element;
- connecting a first part of said at least one contact element in an electroconductive connection with at least one of respective said contact surfaces; and
- attaching a housing bounding said power semiconductor module to said external heat sink, whereby said at least one housed element having said at least one contact element minimizes a number of electrical bondings in said power semiconductor module.

12. A method for assembling a power semiconductor module, according to claim 11, wherein said step of attaching said housing further comprises the steps of:
- providing a cover member on said housing;
- at least one pressing member extending away from said cover member toward said substrate,
- affixing said cover member to said housing;
- said at least one pressing member in a pressing contact with at least one of said housed element and said contact element; and
- said at least one pressing member enabling at least one of a secure thermoconductive and a secure electroconductive connection between said at least one of said housed element and said contact element, and said contact surface, thereby minimizing a need for a positive bonding during said step of connecting.

* * * * *